United States Patent
Wu et al.

(10) Patent No.: US 11,525,185 B2
(45) Date of Patent: Dec. 13, 2022

(54) VACUUM SYSTEMS IN SEMICONDUCTOR FABRICATION FACILITIES

(71) Applicant: Taiwan Semiconductor Manufacturing Company, Ltd., Hsinchu (TW)

(72) Inventors: Ming-Fa Wu, Kaohsiung (TW); Wen-Lung Ho, Baoshan Township (TW); Huai-Tei Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 23 days.

(21) Appl. No.: 16/573,235

(22) Filed: Sep. 17, 2019

(65) Prior Publication Data
US 2021/0079522 A1 Mar. 18, 2021

(51) Int. Cl.
| | | |
|---|---|---|
| *C23C 16/44* | (2006.01) | |
| *H01L 21/67* | (2006.01) | |
| *B01D 45/16* | (2006.01) | |
| *C23C 16/455* | (2006.01) | |
| *B01D 45/12* | (2006.01) | |

(52) U.S. Cl.
CPC .......... *C23C 16/4402* (2013.01); *B01D 45/12* (2013.01); *B01D 45/16* (2013.01); *C23C 16/4408* (2013.01); *C23C 16/45589* (2013.01); *H01L 21/67017* (2013.01); *H01L 21/67253* (2013.01)

(58) Field of Classification Search
CPC ......... H01L 21/67253; H01L 21/67017; C23C 16/4402; C23C 16/4408; C23C 16/45589; C23C 16/4412; B01D 45/12; B01D 45/14; B01D 45/16
See application file for complete search history.

(56) References Cited

U.S. PATENT DOCUMENTS

| | | | | |
|---|---|---|---|---|
| 1,958,577 A | * | 5/1934 | Hirshfeld | B07B 7/08 55/355 |
| 5,085,673 A | * | 2/1992 | Bentley | B03C 3/014 95/29 |
| 5,562,758 A | * | 10/1996 | Awaji | B01D 45/18 55/300 |
| 6,562,109 B2 | * | 5/2003 | Livingston | B01D 45/14 422/187 |

(Continued)

OTHER PUBLICATIONS

Bashir, K., Design and fabrication of cyclone seperator, publication 10.13140/RG.2.2.20727.83368, Aug. 15, 2015, 34 pages.

*Primary Examiner* — Michael M Trinh
(74) *Attorney, Agent, or Firm* — Slater Matsil, LLP

(57) ABSTRACT

Methods and devices are provided wherein rotational gas-flow is generated by vortex generators to decontaminate dirty gas (e.g., gas contaminated by solid particles) in pumping lines of vacuum systems suitable for use at a semiconductor integrated circuit fabrication facility. The vacuum systems use filterless particle decontamination units wherein rotational gas-flow is applied to separate and trap solid particles from gas prior to the gas-flow entering a vacuum pump. Methods are also described whereby solid deposits along portions of pumping lines may be dislodged and removed and portions of pumping lines may be self-cleaning.

20 Claims, 12 Drawing Sheets

(56) References Cited

U.S. PATENT DOCUMENTS

| | | | | |
|---|---|---|---|---|
| 8,377,160 B2* | 2/2013 | Witter | ................ | B01D 46/0093 |
| | | | | 55/337 |
| 8,549,908 B2* | 10/2013 | Dalla Betta | ........... | G01F 1/6842 |
| | | | | 73/202.5 |
| 9,675,918 B2* | 6/2017 | Loh | ........................... | B04C 5/06 |
| 2007/0175188 A1* | 8/2007 | Tsuji | ...................... | B01D 45/08 |
| | | | | 55/444 |
| 2013/0152522 A1* | 6/2013 | Stippich | ................ | B01J 8/0055 |
| | | | | 55/398 |
| 2015/0111388 A1* | 4/2015 | Takahashi | ......... | H01L 21/31116 |
| | | | | 438/706 |
| 2018/0274094 A1* | 9/2018 | Ikeda | .................. | H01L 21/0228 |
| 2019/0321834 A1* | 10/2019 | Chen | ...................... | B04C 5/103 |
| 2021/0086201 A1* | 3/2021 | Chen | ...................... | B01D 45/08 |

* cited by examiner

VACUUM SYSTEMS IN SEMICONDUCTOR FABRICATION FACILITIES

BACKGROUND

Integrated circuits comprising semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. A series of chemical and physical processes may be performed during the fabrication process flow, using equipment with processing chambers that are often maintained at low pressure or partial vacuum.

The integrated circuit industry continues to improve the integration density of various electronic components (e.g., transistors, diodes, resistors, capacitors, etc.) by continual reductions in minimum feature size, which allow more components to be integrated into a given area, thereby lowering the cost of integrated circuits. Maintaining a continual reduction in manufacturing cost requires a high efficiency integrated circuit fabrication facility and infrastructure that may give rise to additional problems that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
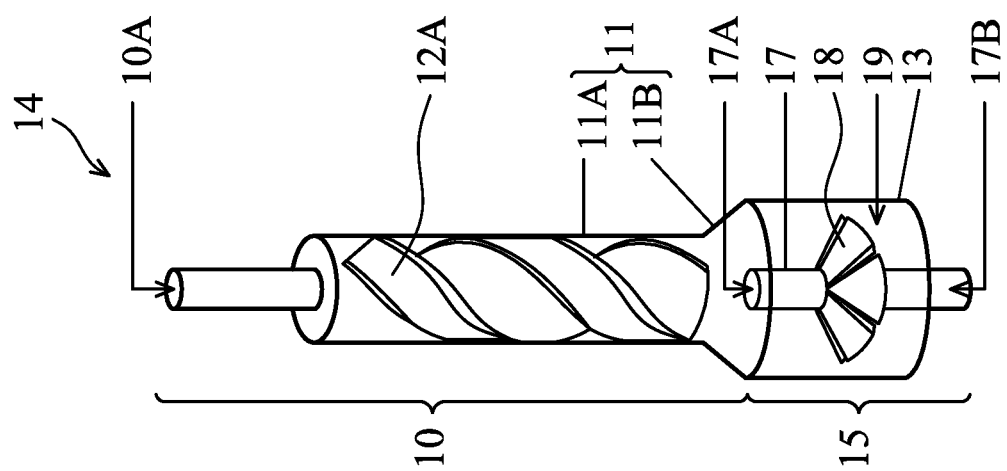
FIGS. 1, 2, and 3A illustrate examples of a stationary-vane particle decontamination unit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit fabrication facility generally utilizes vacuum systems wherein one or more vacuum pumps operate to maintain low pressure (e.g., from sub-atmospheric pressure (<760 Torr) to about a millitorr) in vacuum chambers of many of the processing equipment used to manufacture semiconductor devices. This disclosure describes embodiments of particle decontamination units that may be used in vacuum systems at an integrated circuit fabrication facility to remove or reduce solid particles from the gas-flow in pumping lines (connecting tubes between vacuum chambers and vacuum pumps). Removing solid particulate contaminants from the gas-flow provides the dual benefit of reducing the chance of pump seizure caused by particles jamming moving parts inside a vacuum pump and slowing down the gradual buildup of solid deposits on the walls of pumping lines. The embodiments described in this disclosure use rotational gas-flow (e.g., vortex or spin) to separate solid particulate contaminants from the gas in vacuum pumping lines, and confine the separated particles in filter-less particle trappers prior to the gas reaching the moving parts of a vacuum pump. One advantage of using the embodiments described herein is that the separation technique employs centrifugal force in addition to gravity to direct the particles towards a particle trapper. Accordingly, small particles, such as those 30 μm (or smaller) in diameter, may be removed from the contaminated or dirty gas. An additional benefit from the rotational motion of the gas may be a self-cleaning mechanism wherein existing deposits on the walls of a vacuum pumping line may be dislodged and trapped in a particle trapper with the aid of the centrifugal forces of the rotating gas.

Figure 1:
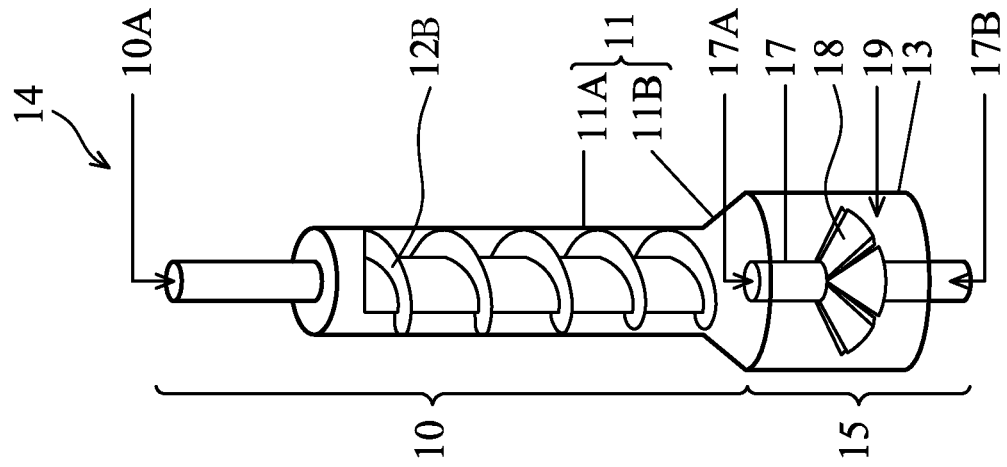

FIGS. 1 and 2 illustrate two examples of stationary-vane particle decontamination units 14 comprising a stationary-vane vortex generator 10 and a particle trapper 15 connected together. The particle trapper 15 is positioned below (e.g., downstream of the gas-flow) the stationary-vane vortex generator 10. The stationary-vane vortex generator 10 includes an inlet 10A, a vortex tube 11, and helical structure. In some embodiments, the helical structure comprises stationary vanes 12 (selectively referring to elements having a reference numeral in the form of "12X" wherein "X" is a letter, such as "12A" and "12B" in FIGS. 1 and 2, respectively). Dirty gas (e.g., gas contaminated with solid particles) may be sucked in through the inlet 10A of the stationary-vane vortex generator 10 into the vortex tube 11. In some embodiments, the vortex tube 11 is a straight tube 11A having the stationary vanes 12 fitted inside an upper (e.g., upstream) portion of the vortex tube 11. In some embodiments, such as in the embodiment illustrated in FIG. 1, the shapes of the stationary vanes 12 bear a likeness to a helical twisted drill and may be referred to as twisted-drill helical stationary vanes 12A. In some embodiments, such as in the embodiment illustrated in FIG. 2, the stationary vanes 12 of the stationary-vane vortex generator 10 attach to a central stem, similar to the shape of an auger drill, and may be referred to as auger helical stationary vanes 12B. In the examples in FIGS. 1 and 2, the vortex tube 11 includes an optional short conical section 11B to smoothly connect the straight tube 11A to the wider particle trapper 15.

As illustrated in FIGS. 1 and 2, in some embodiments, the particle trapper 15 comprises two concentric tubes, a wide outer tube 13 and a narrow inner tube 17. A longitudinal axis of the outer tube 13 and the inner tube 17 may be positioned along a longitudinal axis of the particle trapper 15. A space forming a concentric ring between the outer tube 13 and the inner tube 17 of the particle trapper 15 is referred to as a trapping chamber 19. A trapper element 18 is shown inside the trapping chamber 19. In some embodiments, the trapper element 18 comprises one or more flaps or fins protruding from an outer sidewall of the inner tube 17 (illustrated in FIGS. 1 and 2) or from an inner sidewall of the outer tube 13, as discussed in greater detail below with reference to FIGS. 3B-3D. In some embodiments, the trapper element 18 extends completely around a circumference of a sidewall of the respective tube (e.g., outer sidewall of the inner tube 17 and/or inner sidewall of the outer tube 13) to which the flaps are attached, thereby obstructing the passage of material within the trapping chamber 19. The outer tube 13 of the particle trapper 15 has a closed bottom and an open top that connects to the vortex tube 11 above (e.g., upstream). The inner tube 17 is also connected to the vortex tube 11 via the inlet 17A positioned above the trapper element 18. The inner tube 17 passes through the outer tube 13 and has an outlet 17B located below the bottom surface of the outer tube 13. Gas and solid particles may enter the trapping chamber 19. The gas may exit the trapping chamber 19 in a reverse flow, but reverse flow of solid particles may be partially blocked by the trapper element 18, as described in greater detail below. The reverse gas flow may be sucked into the inlet 17A of the inner tube 17 and exit through the outlet 17B to proceed downstream of the particle trapper 15.

The relative dimensions of the various components in the embodiments illustrated in FIGS. 1 and 2 are for example only. The dimensions (e.g., widths of the vortex tube 11A, the outer tube 13, and the inner tube 17) may be adjusted according to the sizes of various parts, the gas-flow rates, valve settings, vacuum demand of various processing equipment, and other constraints of the particular vacuum system wherein the stationary-vane particle decontamination units 14 may be used. For example, the inlet 10A of the vortex generator 10 in FIGS. 1 and 2 is narrower than the straight tube 11A of the vortex tube 11 of the stationary vane vortex generator 10. The wider vortex tube 11 may be used to accommodate the larger diameter specified for the stationary vanes 12. Also, in FIGS. 1 and 2, the outer tube 13 of the particle trapper 15 is shown not only to be wider than the inner tube 17, but also wider than the straight portion 11A of the vortex tube 11. The dimensions of the outer tube 13, the inner tube 17, and the vortex tube 11 may be adjusted for a desired two-phase (solid and gas) flow whereby some of the solid particles in the incoming gas-flow separate out and fall into the trapping chamber 19 while the decontaminated cleaner gas flows out through the outlet 17B of the inner tube 17. Other dimensions (e.g., widths, lengths, angles, and radii of curvature) may be likewise utilized to adjust the flow rates and pressures at various locations throughout the vacuum system.

Figure 3A:
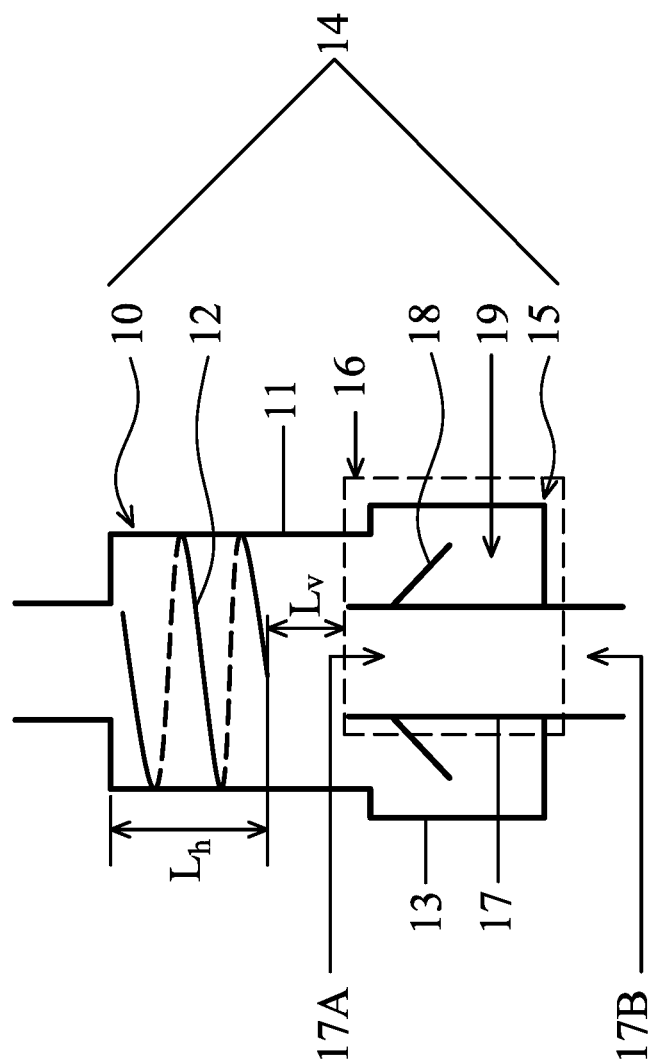

FIG. 3A displays a simplified cross-sectional schematic of the stationary-vane particle decontamination units 14 illustrated in FIGS. 1 and 2. The curved stationary vanes 12, represented by a zig-zag line in FIG. 3A, may be the twisted-drill helical stationary vanes 12A illustrated in FIG. 1, or the auger helical stationary vanes 12B illustrated in FIG. 2, or stationary vanes of any other suitable shape that may be used to generate a rotational motion in a gas flowing through the stationary-vane vortex generator 10. The vorticity of the gas-flow created by helical vanes depends on the helix angle of the curved stationary vanes 12. The helix angle is the acute angle between the central axis of symmetry and a tangent line parallel to an inclined surface of the helix. (A helix angle of 0° means the vanes are parallel to the central axis and a helix angle of 90° means the vanes are perpendicular to the axis.) In general, the vorticity increases if the vanes are inclined further towards the normal to the central axis. In some embodiments, the helix angle may be from about 5° to about 85°, such as about 60°. An excessively large helix angle (e.g., greater than about 85°) impedes the gas-flow and slows down the vacuum pump, and an excessively small angle (e.g., less than about 5°) creates an insufficient centrifugal force to push the solid particles in the gas away from the inner tube 17 located close to the central axis of the vortex tube 11, thereby lowering the particle separation efficiency.

The dirty gas entering the vortex generator 10 through the inlet 10A may spin down a length, $L_h$, of the helical stationary vanes 12, as illustrated in FIG. 3A. The helix length, $L_h$, is related to the number of turns of the helix and the helix angle. In some embodiments, a number of turns of the curved stationary vanes 12 for a stationary-vane vortex generator 10 may be greater than about one eighth of a turn, such as about 10 turns, and $L_h$ may be about 5 cm to about 100 cm, such as about 30 cm. In some embodiments, a stationary-vane generator 10 having less than about one eighth of a turn or having $L_h$ less than about 5 cm may generate an insufficient vorticity to sufficiently separate the solid particles. A stationary-vane generator 10 having greater than about 10 turns or a length greater than about 100 cm may reduce the pumping speed due to low flow conductance.

The exit of the helical stationary vanes 12 may be at an angle to the wall of the vortex tube 11 to facilitate the gas to continue to rotate. The vortex may flow downstream in the vortex tube 11 towards the top of the particle trapper 15. The inlet 17A of the inner tube 17 is located near the top of the particle trapper 15. In some embodiments, the length, $L_v$, between the inlet 17A and the exit of the helical stationary vanes 12 may be about 5 cm to about 150 cm. In the example embodiment in FIG. 3A, the inner tube 17 of the particle trapper 15 extends a short length above (e.g., upstream) the top of the outer tube 13, so the inlet 17A of the inner tube 17 is positioned inside the vortex tube 11. However, it is understood that in some other embodiments, the inlet 17A may be at the same level, or a short distance below the top of the outer tube 13.

As illustrated in FIG. 3A, the top of the particle trapper is open and connected to the bottom of the vortex tube 11, thereby forming a passage for the vortical gas-flow created in the vortex generator 10 to enter the particle trapper 15. Solid particles rotating in the vortex inside the vortex tube 11 and the outer tube 13 of the particle trapper 15 may be pushed radially outwards by centrifugal forces. The radial motion of solid particles relative to the gas increases the particle concentration towards the circumference of the vortex tube 11, leaving a relatively clean gas near the central axis of the vortex tube 11 and the outer tube 13. The cleaner central gas may be sucked into the inlet 17A of the inner pipe 17. The inner tube 17 provides a path for decontaminated gas to exit the stationary-vane decontamination unit 14 through the outlet 17B of the inner tube 17 below the bottom surface of the particle trapper 15. The diameter of the inner tube 17 may be from about 50 mm to about 250 mm. A ratio of a diameter of the inner tube 17 to a diameter of the vortex tube 11 of the stationary-vane vortex generator 10 may be about 0.2 to about 0.9, and a ratio of the diameter of the inner tube 17 to the diameter of the outer tube 13 of the particle trapper 15 may be about 0.2 to about 0.9. For example, the diameters of the inner tube 17, the outer tube 13 of the particle trapper 15, and the vortex tube 11 of the stationary-vane vortex generator 10 may be 10 cm, 20 cm, and 16 cm, respectively.

As explained above, the vortical flow may contain solid particulate contaminants concentrated by centrifugal forces towards the periphery of the vortex tube 11 and the outer tube 13. Some of the solid particles may be directed by gravity further into the trapping chamber 19 past a trapper element 18 into a bottom portion of the trapping chamber 19. Trapper element 18 located inside the trapping chamber 19 (illustrated in FIG. 3A by the inclined lines on the outer surface of the inner tube 17) may prevent some of the solid particles from exiting the bottom portion of the trapping chamber 19. Dirty gas entering the trapping chamber 19 may exit the particle trapper 15 in a reverse flow, leaving behind some of the solid contaminants at the bottom portion of the trapping chamber 19 below the trapper element 18.

Figure 3D:
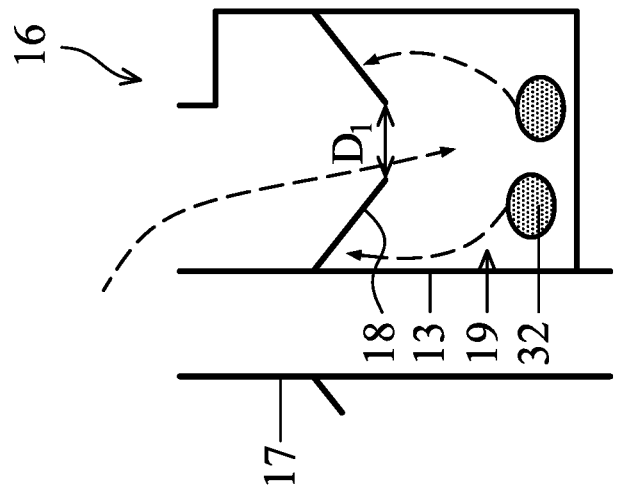
FIGS. 3B, 3C, and 3D illustrate examples of a magnified portion of a particle trapper, in accordance with some embodiments.
Figure 3C:
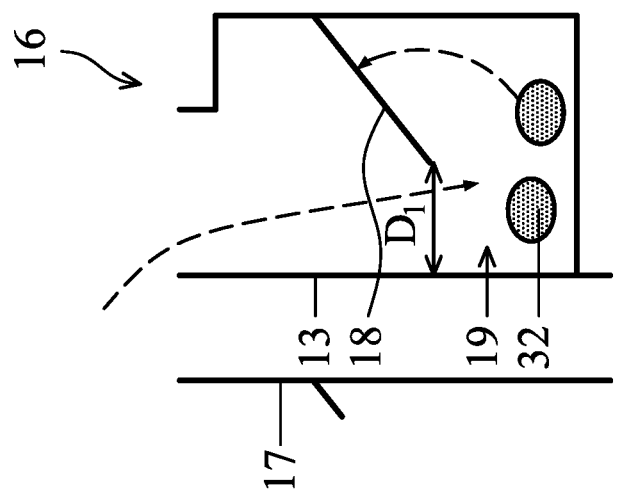
Figure 3B:
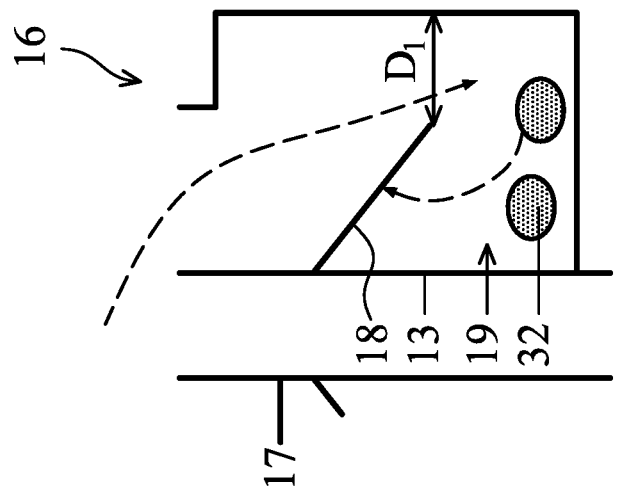

Various designs may be utilized in the construction of the trapper element 18. FIGS. 3B through 3D display a magnified view of the region 16 (indicated by the dashed rectangle in FIG. 3A) to illustrate three example designs of the trapper element 18 comprising flaps inclined downwards and attached along a circumference of the trapping chamber 19. The downward inclination favors the flow of solid particles 32 from the upper portion of the trapping chamber 19 into the region below the trapping element 18 in preference to a reverse flow of solid particles 32 in the opposite direction. In FIG. 3B, the inclined flaps are attached along a circumference of an outer surface of the inner tube 17; while in FIG. 3C, the flaps of the trapper element 18 are attached along a circumference of an inner surface of the outer tube 13 on the opposite wall of the trapping chamber 19. In FIG. 3D, the trapper element 18 comprise two sets of inclined flaps: one set is attached along a circumference of the outer surface of the inner tube 17 and another similar set is attached along a circumference of the opposite wall of the trapping chamber 19. The sizes of the flaps may be selected such that the trapper element 18 maintain a distance $D_1$ between the flaps and a wall of the trapping chamber 19 (for the trapper element 18 in FIGS. 3B and 3C) or between the two sets of flaps (for the trapper element 18 in FIG. 3D). In some embodiments, the distance $D_1$ may be about 1 mm to about 100 mm. Solid particles 32 that fall into the trapping chamber 19 due to their weight (as described above) may drop through the gap of width $D_1$ (as indicated by a dashed arrow pointing downward in FIGS. 3B-3D) to a bottom portion of the trapping chamber 19 below the trapper element 18. The gap-size $D_1$ and the downward inclination angle of the trapper element 18 reduces the reverse flow of the solid particles 32 (as indicated by the dashed arrows pointing upwards in FIGS. 3B-3D). In some embodiments, the angle of inclination may be about 5° to about 80°. The particle removal efficiencies may be enhanced at elevated temperatures. The temperature of trapping chamber 19 can be controlled from 10° C. to 300° C., for example 150° C. In some embodiments, the stationary-vane decontamination unit 14 may be maintained at a temperature of about 23° C. to about 300° C.

Figure 3E:
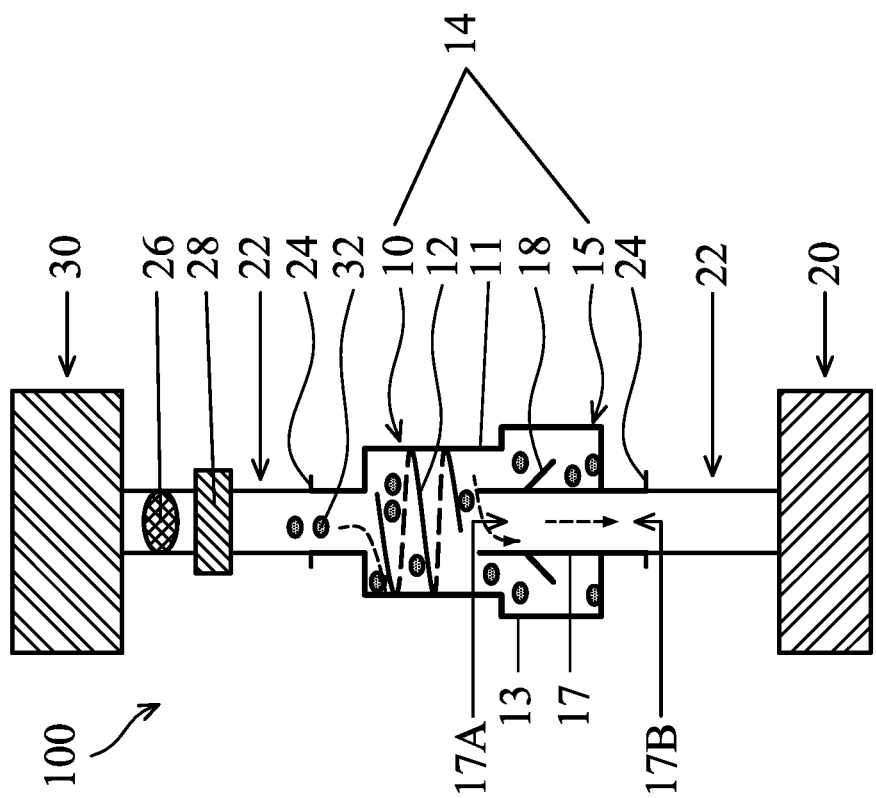
FIG. 3E illustrates an example of a vacuum system in an integrated circuit fabrication facility, in accordance with some embodiments.

FIG. 3E illustrates a vacuum system 100 connected to a processing chamber 30 in a semiconductor integrated circuit fabrication facility. Valves (e.g., the throttle valve 26 and the isolation valve 28) may be used in the path of the gas-flow to control the pressure inside the processing chamber 30, as discussed in greater detail below. The vacuum system comprises a pumping line 22 (sometimes referred to as the suction line) which distributes a partial vacuum to one or more pieces of equipment, vacuum pumps (e.g., the vacuum pump 20) which expel gas from the pumping line 22 to meet the vacuum demand of the processing chamber 30 for a particular application, and decontamination units (e.g., the stationary-vane decontamination unit 14) inserted in the suction path prior to the vacuum pump 20 to trap solid material before entering the pump and causing the pump to seize.

Several classes of process equipment used to fabricate semiconductor integrated circuits use a reliable, high-quality vacuum system in order to function. Processes, such as vapor-phase epitaxy (VPE), low-pressure chemical vapor deposition (LPCVD), sub-atmospheric CVD (SACVD), plasma-enhanced CVD (PECVD), high-density plasma CVD (HDP-CVD), physical vapor deposition (PVD), reactive ion etch (RIE), sputter etch, ion implantation, and the like use a partial vacuum in the chamber of the equipment where the semiconductor substrate would be processed. For example, a partial vacuum is used for an ion implanter to ensure that dopant ions in the ion beam strike the semiconductor substrate with a precise velocity. In order to achieve the suitable control, the accelerating/decelerating column of the ion implanter is pumped to a low pressure (e.g., <50 mTorr) to reduce the chance of collisions between dopant ions and ambient gas molecules.

In some processes (e.g., LPCVD, SACVD, and HDP-CVD), the chamber pressure may be controlled to a particular value to meet specific process conditions. Various types of pressure control methods may be used to control the pressure of the partial vacuum in a processing chamber, such as the processing chamber 30 in FIG. 3E. For example, illustrated in FIG. 3E, is a throttle valve method, wherein a throttle valve 26 is inserted between the processing chamber 30 and the vacuum pump 20. The throttle valve 26 is a restriction in the pumping line 22 allowing a pressure drop between the processing chamber 30 and the vacuum pump 20. In this example, the throttle valve 26 allows the vacuum pump 20 to operate at high vacuum, while the partial vacuum in the processing chamber 30 may be maintained at a higher pressure, in accordance with the specifications of the process. The function of the isolation valve 28 is to isolate the processing chamber 30 from the vacuum pump system. The isolation valve 28 may be closed, for example, to clean the chamber or perform repairs within the processing chamber 30. When the isolation valve 28 is closed to isolate the processing chamber 30 from the pumping line 22, the decontamination unit 14 is inactive, and the throttle valve 26 has no function. During the wafer processing steps wherein it is desirable to pump exhaust gases from the processing chamber 30 to flow through the decontamination unit 14, the isolation valve 28 is kept open, and the throttle valve 26 is adjusted in accordance with the pressure desired in the processing chamber 30. Some embodiments may utilize other methods of pressure control. For example, if the vacuum system 100 was using recycle control or by-pass regulation, then gas discharged by the vacuum pump would be recycled to the pumping line through a recycle valve. The recycled gas would act as an artificial additional load on the pump to achieve the desired pressure. Another method that may be utilized is a vacuum relief valve or a bleed method, wherein a deliberate leak is created by allowing air (or some other gas) to enter the pumping line through a line controlled by a pressure switch.

Still referring to FIG. 3E, the inner diameter of a pumping line (e.g., the pumping line 22) used in a semiconductor integrated circuit fabrication facility may be from about 5 cm to about 60 cm (e.g., 10 cm) and the total length may be about 1 m to very long lengths (e.g., 30 m). A vacuum pump 20 connected to the pumping line 22 may be used to create a partial vacuum (e.g., 1 Torr) in the pumping line 22. In some embodiments, the pressure inside a pumping line is about 1 mTorr to about 100 Torr. A vacuum pump at a semiconductor integrated circuit factory may be operated at a speed of about 8,000 L/min to about 80,000 L/min (e.g., 30,000 L/min) to create the low pressure in the pumping line 22. Many kinds of vacuum pumps (e.g., rotary pumps, diffusion pumps, turbomolecular pumps, cryogenic pumps, and ion pumps may be used. Some vacuum pumps (e.g., rotary pumps) are designed with very small clearances (e.g., about 100 μm down to about 30 μm) between rotating parts and stationary parts to minimize leakage from the discharge side back to the suction side. For example, the rotary vane pump may be designed to leave a very small gap (e.g., a 40 μm gap) between the rotor and the casing, hence there is a risk for the rotor jamming if the gas being sucked into the pump has a high count of particles having diameters larger than the clearance available for the rotor to rotate. A decontamination unit, such as the stationary-vane decontamination unit 14 in the vacuum system 100, uses centrifugal force as well as gravity to remove particles from an incoming gas. Accordingly, the stationary-vane decontamination unit 14 reduces some of the particles that could obstruct the minimum clearance available for the moving parts of vacuum pump 20.

As illustrated in FIG. 3E, a stationary-vane particle decontamination unit 14 (e.g., such as those described above with reference to FIGS. 1 through 3D) is inserted in the path of the gas-flow between the processing chamber 30 and the vacuum pump 20 in order to reduce the number of solid particles entering the vacuum pump 20, thereby reducing the chance of pump seizure. The stationary-vane particle decontamination unit 14 may be connected to the pumping lines 22 using, for example, pumping-line connection flanges 24. The gas in the pumping line 22 connected between the processing chamber 30 and the decontamination unit 14 may be contaminated with powder-like solid particles 32 of various sizes from about 10 μm to about 100 μm in diameter.

The particles 32 in the dirty gas may be from flakes of solid deposits that build up over time on surfaces such as the walls of processing chambers and pumping lines. Particles 32 may also originate from solid by-products of chemical reactions performed in semiconductor processing steps such as sputter etch, PVD, PECVD, and RIE.

For example, a sputter etch process may use, for example, accelerated $Ar^+$ ions from a plasma comprising Ar gases to dislodge solid particles of CuO from the CuO surface of the wafer. The dirty gas pumped out of the processing chamber 30 during this sputtering process may comprise CuO solid by-products along with Ar gases.

As another example, during a PVD process used to deposit Ti, the accelerated $Ar^+$ ions may be directed to bombard a target to dislodge Ti atoms from the target onto the surface of a semiconductor wafer. The exhaust from the processing chamber 30 during this PVD process may comprise Ti solid by-products along with Ar gases.

As yet another example where the gas exiting the processing chamber includes solid particles, a PECVD process depositing $SiO_2$ on a silicon wafer may create solid by-products. In this example, the PECVD step utilizes the precursor gases $SiH_4$ and $N_2O$ with $N_2$ as a diluent or carrier gas. The chemical reaction between the reactants $SiH_4$ and $N_2O$ produces $SiO_2$, $H_2$, and $N_2$. Among the reaction products, $SiO_2$ particles may flow as solid by-products along with the $H_2$ and $N_2$ gases into the pumping line 22.

In yet another example, an RIE process to etch silicon nitride ($Si_3N_4$) may use nitrogen trifluoride ($NF_3$), wherein the reaction by-products may include fluorides of silicon ($SiF_x$) that are solids. The exhaust from the processing chamber 30 for this RIE process may contain, for example, solid by-products of $SiF_4$ and $N_2O$ and $N_2$ gases.

During processes such as those described above (e.g., the sputter etch, PVD, PECVD, and RIE examples), a portion of the solid by-products formed during processing may enter the gas stream in powder form (e.g., the solid particles 32 shown in FIG. 3E). By keeping the isolation valve 28 open, the dirty exhaust gas stream may exit from the processing chamber 30 and enter the vortex generator 10. A decontamination unit, such as the stationary-vane decontaminant unit 14 in FIG. 3E, performs the dual function of separating out at least a portion of the solid particles from the gas and trapping the solid particles in a trapping chamber 19. In some embodiments, separation of the solid particles 32 from the gas may be achieved in part using centrifugal forces. As explained above with reference to FIGS. 3A-3D, the dirty gas entering the stationary-vane vortex generator 10 acquires a rotary motion as it flows along the turns of the helical vanes in the vortex tube, creating a vortical contaminated gas flow. Upon exiting from the helix into the space above the inlet 17A of the inner tube 17, the vortical contaminated gas flow may have sufficient spin to provide a centrifugal force to push the particles 32 outwards. The radial motion may cause the particles 32 to enter a ring-shaped space around the inner pipe 17 of the particle trapper 15. The trapper element 18 may confine the particulate contaminants to the portion of the trapping chamber 19 below the trapper element 18. The clean gas having a reduced amount of particulate contaminants may be drawn into the inlet 17A of the inner tube 17 and sucked out from the outlet 17B into the pumping line 22 below the stationary-vane particle decontamination unit 14 by the vacuum pump 20.

Figure 4B:
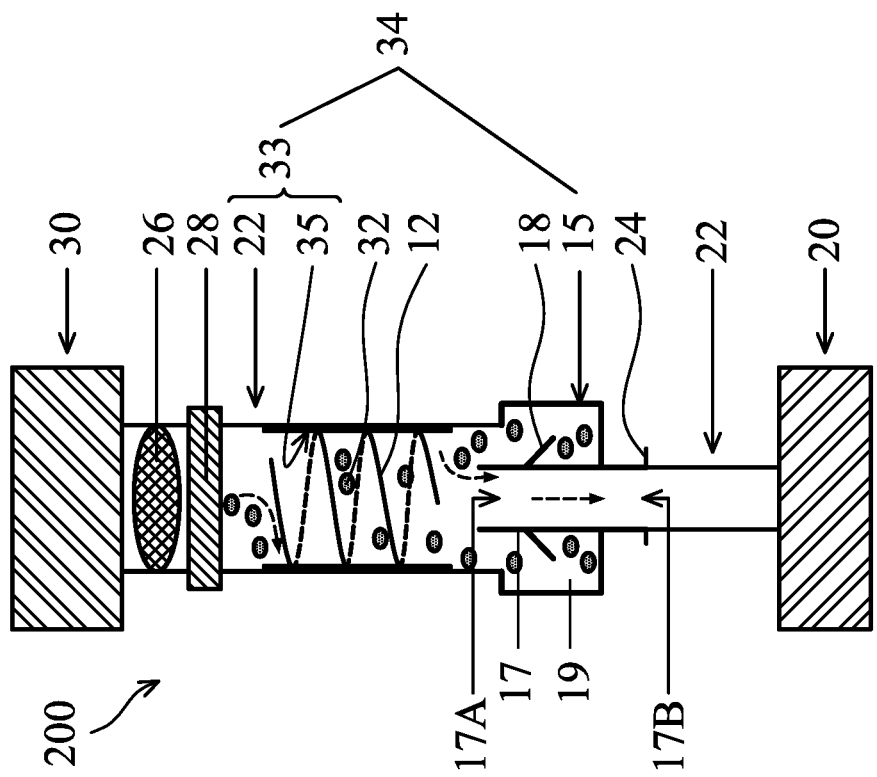
FIG. 4B illustrates an example of a vacuum system in an integrated circuit fabrication facility, in accordance with some embodiments.
Figure 4A:
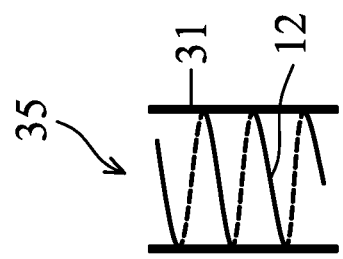
FIG. 4A illustrates an example of an inner stationary-vane kit, in accordance with some embodiments.

FIG. 4A illustrates an inner stationary-vane kit 35 that may be inserted inside a pumping line. An inner stationary-vane kit 35 mimics the construct of the vortex tube 11 and the stationary-vanes 12 of the stationary-vane vortex generator 10 (described above with reference to FIGS. 1 through 3A). Similar to the vortex tube 11, the inner stationary-vane kit 35 comprises a vane-kit tube 31 fitted with curved stationary vanes 12, for example the helical stationary vanes 12A (illustrated in FIG. 1) or the helical stationary vanes 12B (in FIG. 2). In some embodiments, an inner stationary-vane kit 35 of the appropriate dimensions may be inserted inside a section of a pumping line 22 in order to force rotational motion in the gas flowing in the pumping line 22, as illustrated in FIG. 4B.

FIG. 4B illustrates a processing chamber 30 connected to the pumping line 22 of a vacuum system 200, wherein a portion of the pumping line 22 has an inner stationary-vane kit 35. The pumping line 22 fitted with the inner stationary-vane kit 35, as illustrated in FIG. 4B, may function as a vane-kit vortex generator 33, similar to the stationary-vane vortex generator 10, described above with reference to FIGS. 1 through 3E. The open bottom of the vane-kit vortex generator 33 is shown connected to a particle trapper 15. The particle trapper 15 in FIG. 4B may be same as or similar to the particle trapper 15 illustrated in FIGS. 1-3E. The vane-kit vortex generator 33 in conjunction with the particle trapper 15, collectively referred to as a vane-kit particle decontamination unit 34, may function same as or similar to the stationary-vane particle decontamination unit 14 in the embodiment illustrated in FIGS. 1-3E. Similar to the vacuum system described with reference to FIG. 3E, the solid particles 32 in the dirty gas entering the decontamination unit are separated using the centrifugal forces of the spinning gas in the vane-kit vortex generator 33 and the weight of the particles 32. The separated particles 32 that drop below the trapper element 18 in the trapping chamber 19 may be trapped the trapping chamber 19, while the clean gas is sucked out through the outlet 17B of the inner tube 17 of the particle trapper 15. The outlet 17B of the inner tube 17 is shown connected to a vacuum pump 20 via a pumping line 22 below (e.g., downstream) the decontamination unit. In some embodiments, the vane-kit decontamination unit 34 may be maintained at a temperature of about 23° C. to about 300° C.

Figure 5A:
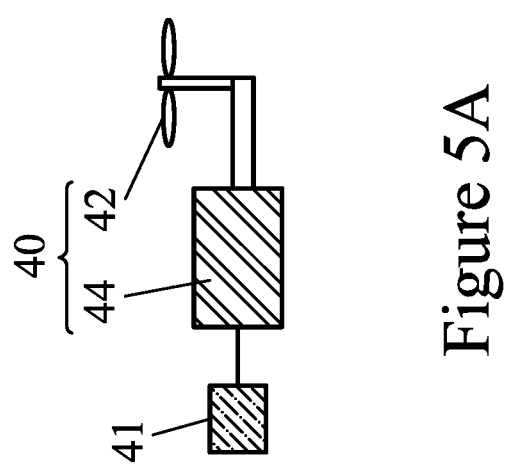
FIG. 5A illustrates an example of a rotatory-fan and controller, in accordance with some embodiments.
Figure 5B:
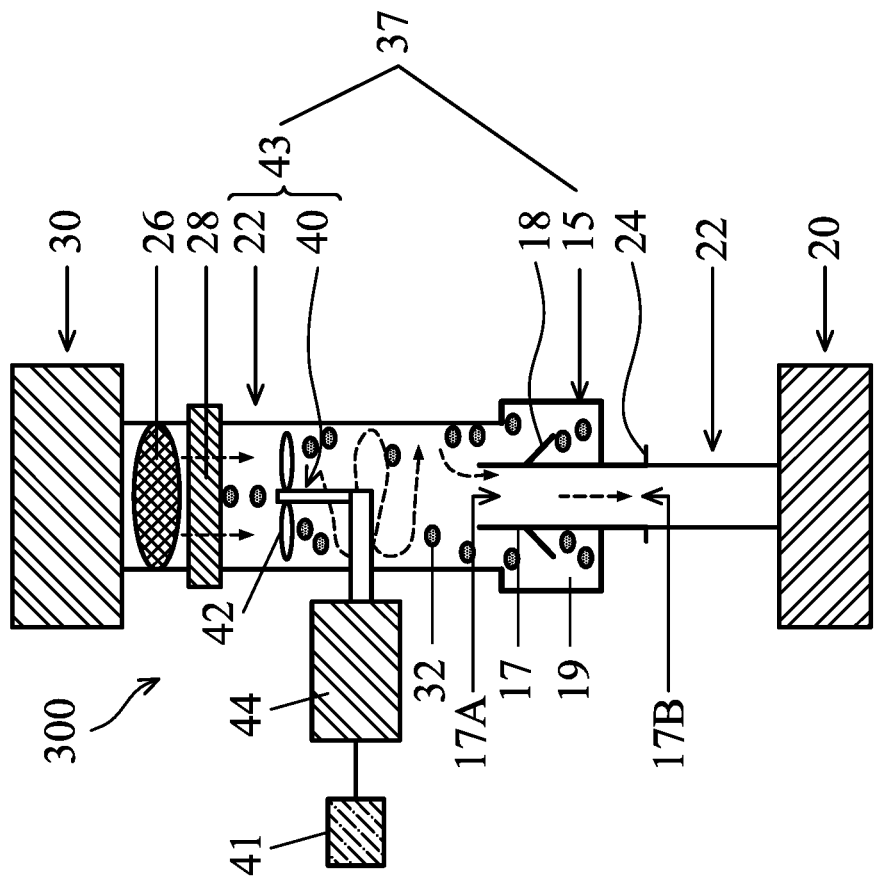
FIG. 5B illustrates an example of a vacuum system in an integrated circuit fabrication facility, in accordance with some embodiments.

In some embodiments, the vortex generator 10 may comprise a rotary fan. For example, FIG. 5A illustrates an embodiment in which a vortex may be generated using a rotatory fan 40 coupled to a fan controller 41. The rotatory fan 40 comprises two or more rotor blades 42 connected to an electric motor 44. The number of blades may be from 2 to about 8. The electric motor 44 may be used to spin the rotor blades 42 with a rotational speed of about 1000 rpm to about 7000 rpm, as controlled by the fan controller 41. The rotor blades 42 may be tilted to create a downstream vortical gas-flow when the rotatory fan 40 is operated inside a pumping line 22, as illustrated in FIG. 5B. In FIG. 5B a processing chamber 30 is shown connected to the pumping line 22 of a vacuum system 300, wherein the pumping line 22 has been fitted with a rotatory fan 40 such that the rotor blades 42 may rotate about an axis coincident to a longitudinal axis of the pumping line 22. The tilt angle (the angle between a plane of the rotor blade 42 and a plane normal to an axis of rotation of the rotary fan 40) may be from about 5° to about 85°. If the tilt angle is excessively small (e.g., less than 5°) then spinning the rotor blades 42 generate insufficient rotatory motion of the gas in the pumping line 22 to separate the solid particles 32. If the tilt angle is too large (e.g., greater than 85°) then the vertical flow is reduced, thereby slowing down the pumping speed and the ability to form a proper vacuum/low pressure environment. The controller 41 may adjust the rotational speed adaptively in accordance with the flow rate and pressure in the pumping line 22. For example, a higher gas flow rate through the pumping line 22 may require a higher rotational speed of the rotatory fan 40 in order to impart a sufficient vorticity to the gas flow, while a lower gas flow rate through the pumping line 22 may require a lower rotational speed of the rotatory fan 40. In some embodiments, the tilt angle of the rotor blades 42 may also be adjustable using a servo motor controlled by the controller 41. The dimension of the rotor blades 42 may be designed to leave a small clearance of about 5 mm to about 20 mm between the blades and the inner wall of the pumping line 22. In some embodiments, the ratio of the radius of rotation of the rotatory fan 40 to the inner radius of the pumping line 22 may be about 0.4 to about 0.9.

In some embodiments, the motor 44 is located outside the pumping line 22 and mechanically connected to the rotor blades 42, as illustrated in FIG. 5B. In some embodiments, the motor 44 may be located inside the pumping line 22. In FIG. 5B, the pumping line 22 fitted with the rotatory fan 40 may function as a rotatory-fan vortex generator 43. The bottom of the rotatory-fan vortex generator 43 in FIG. 5B is connected to a particle trapper 15, similar to the vane-kit vortex generator 33 (see FIG. 4B) and the stationary-vane vortex generator 10 (see FIGS. 1-3A), described above. In some embodiments, for example, the vacuum system 300 illustrated in FIG. 5B, the rotatory-fan vortex generator 43 in conjunction with the particle trapper 15, collectively referred to as a rotatory-fan particle decontamination unit 37, may function similar to the respective particle decontamination units 14 and 34 in the vacuum systems 100 and 200 illustrated in FIGS. 3D and 4B, respectively, except the vortex in the rotatory-fan particle decontamination unit 37 in FIG. 5B is generated by spinning the fan rotor blades 42 instead of flowing gas along fixed helical stationary vanes 12. The dashed arrows in FIG. 5B indicate the gas flow. A pair of dashed arrows above (e.g., upstream) the fan 40 and the spiral dashed arrow below (e.g., downstream) the fan indicate that the rotor blades 42 of the fan 40 may impart vorticity to the gas-flow as it flows through the rotatory-fan vortex generator 43. The vorticity may increase with increasing rotational speed of the rotatory fan 40 and/or angle of the rotor blades 42. As in the decontamination units 14, and 34 described above with reference to FIGS. 1 through 4B, the vortical gas-flow in the rotatory-fan decontamination unit 37 helps separate the solid particles 32 from the dirty gas before the clean gas is sucked into the vacuum pump 20. In some embodiments, the rotatory-fan decontamination unit 37 may be maintained at a temperature of about 23° C. to about 300° C.

Figure 6B:
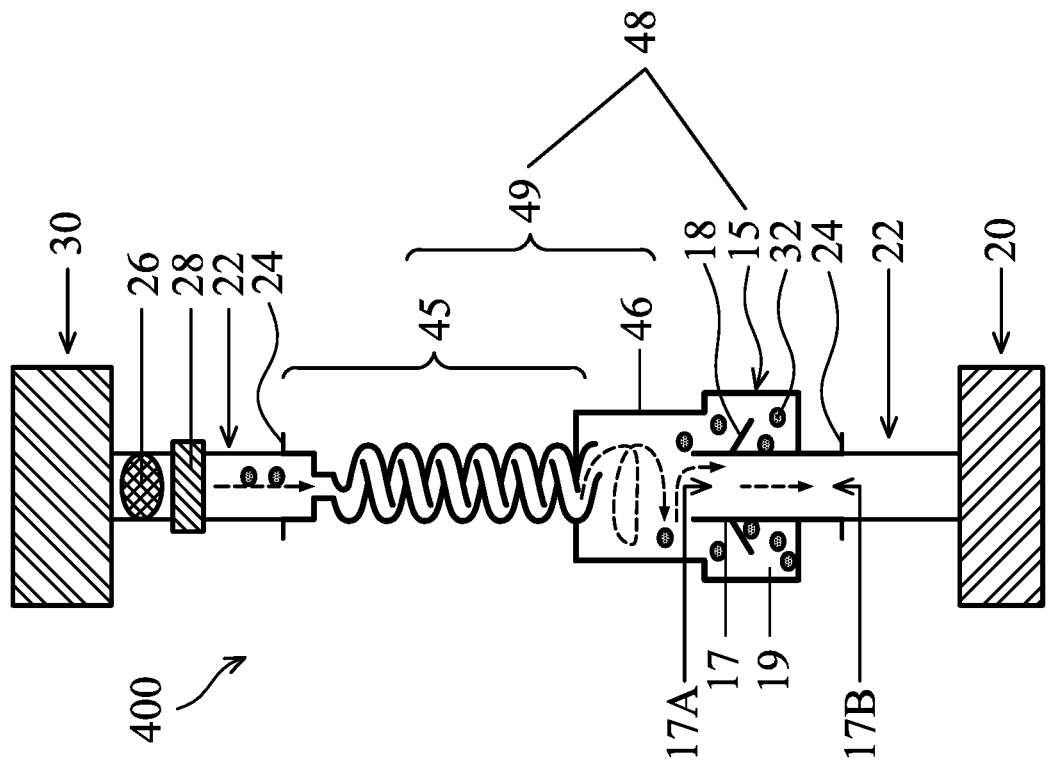
FIG. 6B illustrates an example of a vacuum system in an integrated circuit fabrication facility, in accordance with some embodiments.
Figure 6A:
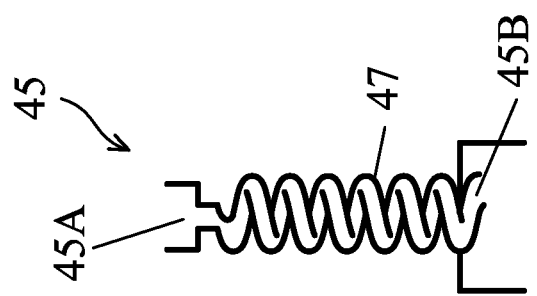
FIG. 6A illustrates an example of a helical tube, in accordance with some embodiments.

Referring now to FIG. 6A, a helical tube 45 is illustrated that may be used to force rotation in a gas flow when it gets sucked into an inlet 45A and flows through the helix 47 and out an outlet 45B. The outlet 45B of the helical tube 45 may be the last helical turn of the helix 47 and thereby inclined to the central axis of symmetry of the helix 47.

FIG. 6B illustrates a processing chamber 30 connected to the inlet of the pumping line 22 of a vacuum system 400, wherein the pumping line 22 is connected to the inlet 45A of a helical tube 45 using, for example, a pumping-line connection flange 24. The helical tube 45 in FIG. 6B extends into a cylindrical vortex chamber 46, in accordance with some embodiments. The gas circulating through the helical tube 45 may exit from the outlet 45B of the helical tube 45 inside the vortex chamber 46 at an angle inclined to the longitudinal axis of the vortex chamber 46 and spin inside the vortex chamber 46, as indicated by the spiral dashed arrow in the illustration in FIG. 6B. In some embodiments, the helix angle may be from about 5° to about 85°. An excessively large helix angle (e.g., greater than about 85°) impedes the gas-flow and slows down the vacuum pump, and an excessively small angle (e.g., less than about 5°) creates an insufficient centrifugal force to push the solid particles in the gas inside the vortex chamber 46 away from the inner tube 17 located close to the central axis of the helical tube 45, thereby lowering the particle separation efficiency.

The length of the helix 47 of the helical tube 45 in FIGS. 6A and 6B is related to the number of turns and the helix angle, similar to that discussed above for the length $L_h$ of the helical stationary vanes 12 in FIG. 3A. In some embodiments, the number of turns of the helix 47 of helical tube 45 may be greater than about one eighth of a turn, such as about 10 turns, and the length of the helix 47 of the helical tube 45 may be about 5 cm to about 100 cm, such as about 30 cm. In some embodiments, a helix 47 of helical tube 45 having less than about one eighth of a turn or having a length less than about 5 cm may generate an insufficient vorticity to sufficiently separate the solid particles. A helix 47 of helical tube 45 having greater than about 10 turns or a length greater than about 100 cm may reduce the pumping speed due to low flow conductance. In one embodiment, a single turn of the helix at a helix angle of 60° may be used.

The helical tube 45 along with the vortex chamber 46 may function as a helical-tube vortex generator 49, as illustrated in FIG. 6B. The open bottom of the vortex chamber 46 is shown connected to a particle trapper 15. The particle trapper 15 in FIG. 6B may be same as or similar to the particle trappers 15 illustrated in FIGS. 1-3E. In some embodiments, such as the vacuum system 400 illustrated in FIG. 6B, the helical-tube vortex generator 49 in conjunction with the particle trapper 15 may collectively function as a particle decontamination unit, referred to as a helical-tube particle decontamination unit 48. As in the respective decontamination units 14, 34, and 37 in the vacuum systems 100, 200, and 300 illustrated in FIGS. 3D, 4B, and 5B, the vortical gas-flow generated using the helical-tube vortex generator 49 helps separate the solid particles 32 from the dirty gas before the clean gas is sucked into the vacuum pump 20. In some embodiments, the helical-tube decontamination unit 48 may be maintained at a temperature of about 23° C. to about 300° C.

Figure 7:
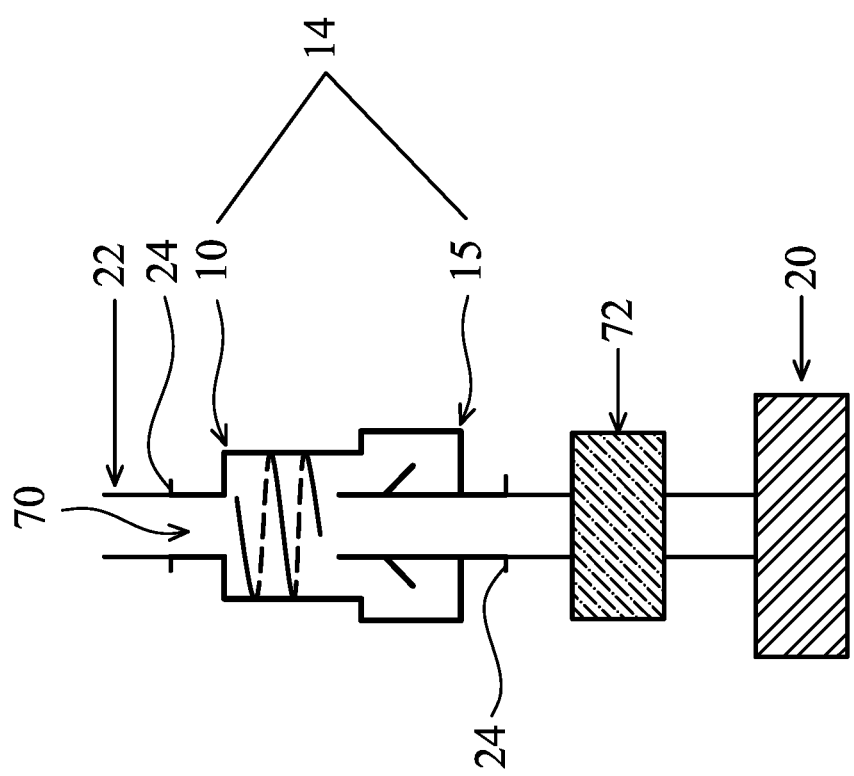
FIG. 7 illustrates an example of a portion of a vacuum system in an integrated circuit fabrication facility, in accordance with some embodiments.

FIG. 7 illustrates an example of the general construct of inserting a particle decontamination unit comprising a vortex generator and a particle trapper to protect operational vacuum pumps from seizure, as done in the vacuum systems 100, 200, 300, and 400 described above. In the example embodiment in FIG. 7, a stationary-vane decontamination unit 14 has been inserted in the pumping line 22 at the inlet 70 of a two-stage vacuum pump system comprising a main pump 20 and a boost pump 72. If the vacuum demand is high then an auxiliary pump, referred to as a boost pump, may be deployed to boost the vacuum that may be established by the main pump. For example, a single 300 mm cluster tool equipped with processing chambers to perform CVD, PVD, and RIE steps designed for a chamber pressure less than 1 mTorr (e.g., 0.75 mTorr) during processing, may require a peak pumping speed of about 30,000 L/min. If the vacuum system is serving several such tools then it is conceivable that, even at its maximum capacity, the main pump 20 may fail to reduce the pressure in the pumping line 22 to below 1 mTorr, in which case the boost pump 72 may be operated to boost the vacuum in the pumping line 22.

In FIG. 7, solid particulate contaminants in dirty gas flowing through the pumping line 22 into the inlet 70 may be separated out by centrifugal forces in a vortex created by the vortex generator 10 and confined in the particle trapper 15 of the stationary-vane decontamination unit 14, while the clean gas may be sucked out of the decontamination unit 14 and expelled by a vacuum pump (e.g., boost pump 72 and main pump 20) through an exhaust valve (not shown). The stationary-vane decontamination unit 14 reduces the chance of seizure caused by particles blocking a gap (e.g., the small clearance for spinning rotor blades) inside either the main vacuum pump 20 or the boost pump 72. Removing solid particles from the gas-flow in a vacuum system provides an additional benefit of reducing the rate at which solid deposits build up on the walls of the pumping lines.

Figure 8:
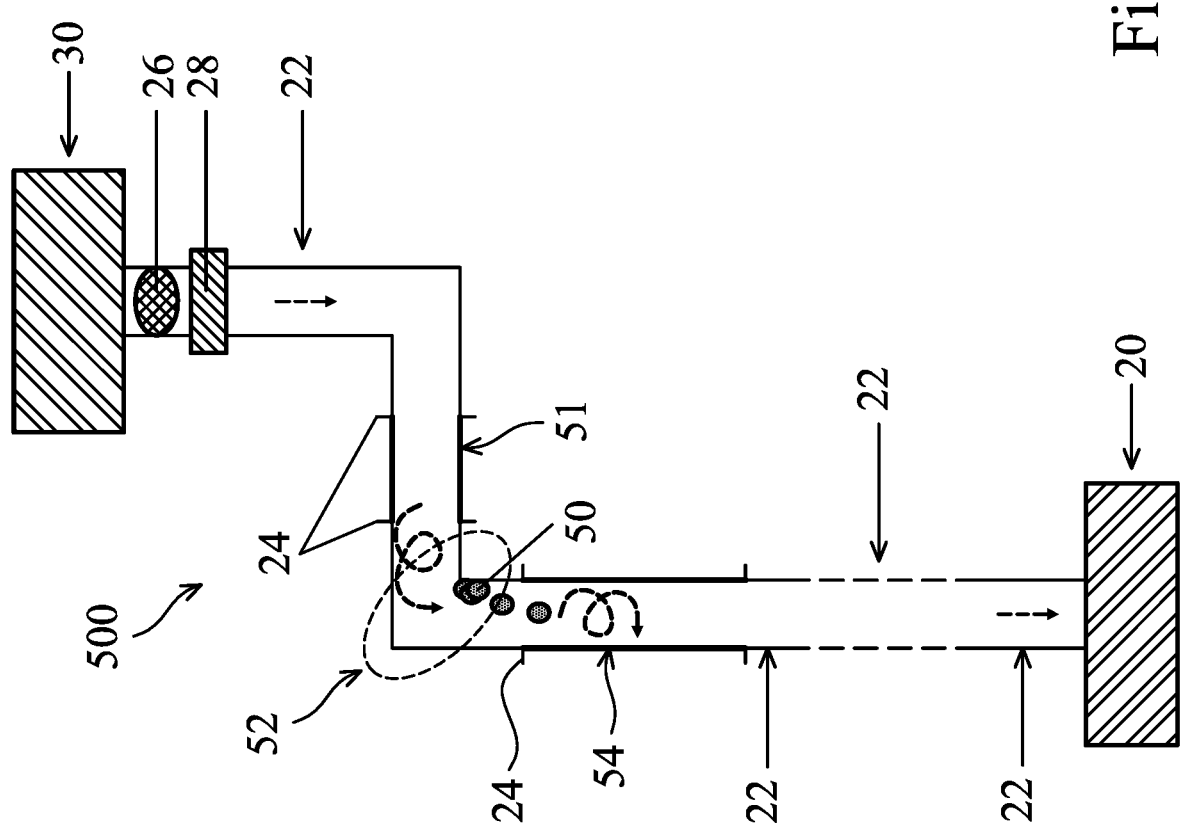
FIG. 8 illustrates an example of a spin-gas self-cleaning pumping line segment in a vacuum system in an integrated circuit fabrication facility, in accordance with some embodiments.

FIG. 8 illustrates a construct for a self-cleaning feature of rotational gas flow being used in a vacuum system 500. As described above, a vortex generator has been used in a particle decontamination unit (e.g., the particle decontamination units 14, 34, 37, and 48) to generate a rotational gas flow to apply centrifugal forces to separate out solid particles from gas flowing in pumping lines of a vacuum system. A vortex generator may be also used to generate a rotational gas flow to help dislodge and remove solid deposits 50 built up over time along the inner walls of pumping lines, such as those discussed above with reference to the sputter etch, RIE, PVD, and PECVD examples. For example, a vortex generator 51 such as those described above may be utilized to generate a rotational gas flow prior to the bend 52 (indicated by the dashed ellipse in FIG. 8) in a pumping line 22, thereby preventing or reducing buildup of solid deposits 50 that may form at a turn 52 in a pumping line 22, illustrated in FIG. 8. As illustrated in FIG. 8, long pumping lines with several turns may be installed in a vacuum system of a semiconductor integrated circuit facility to distribute vacuum to processing chambers (e.g., the processing chamber 30) served by a vacuum pump 20 located remotely, for example, on a different floor of the facility. Solid deposits 50 are prone to form close to the inner corner of a turn or bend in the pumping line where a gas velocity may drop. Accordingly, a vortex generator 51 is inserted in the pumping line 22 upstream from the turn near the bend or some other structure that may exhibit nonuniform gas velocity.

In some embodiments, the vortex generator 51 may be utilizing any of the vortex generation techniques described above, such as using a stationary-vane vortex generator 10, a vane-kit vortex generator 33, a rotatory-fan vortex generator 43, or a helical-tube vortex generator 49 to disturb the laminar flow. The turbulence created by the vortex generator 51 (indicated by a spiral dashed line in FIG. 8) may be able to dislodge a portion of the solid deposit 50 and aid in reducing further buildup of the solid deposits 50. As also illustrated in FIG. 8, in some embodiments, a decontamination unit 54 may be inserted further downstream to entrap the dislodged solid material. Accordingly, a portion of the pumping line 22 may be made to be self-cleaning by inserting a vortex generator 51 upstream and a decontamination unit 54 downstream. The decontamination unit 54 may be one of the filterless decontamination units illustrated in FIGS. 3D, 4B, 5B, and 6B, or a decontamination unit with a filter.

Figure 9A:
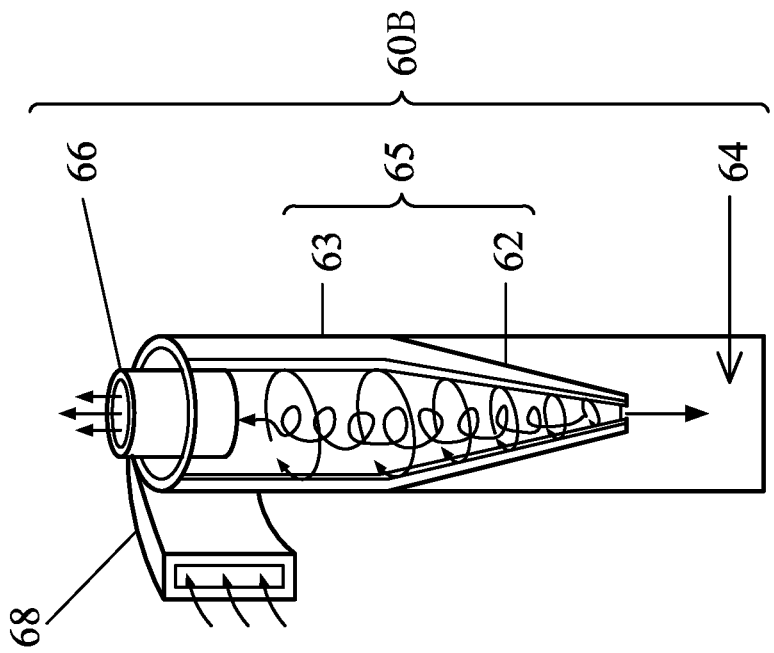
FIG. 9A illustrates an example of a cyclonic particle decontamination unit, in accordance with some embodiments.
Figure 9B:
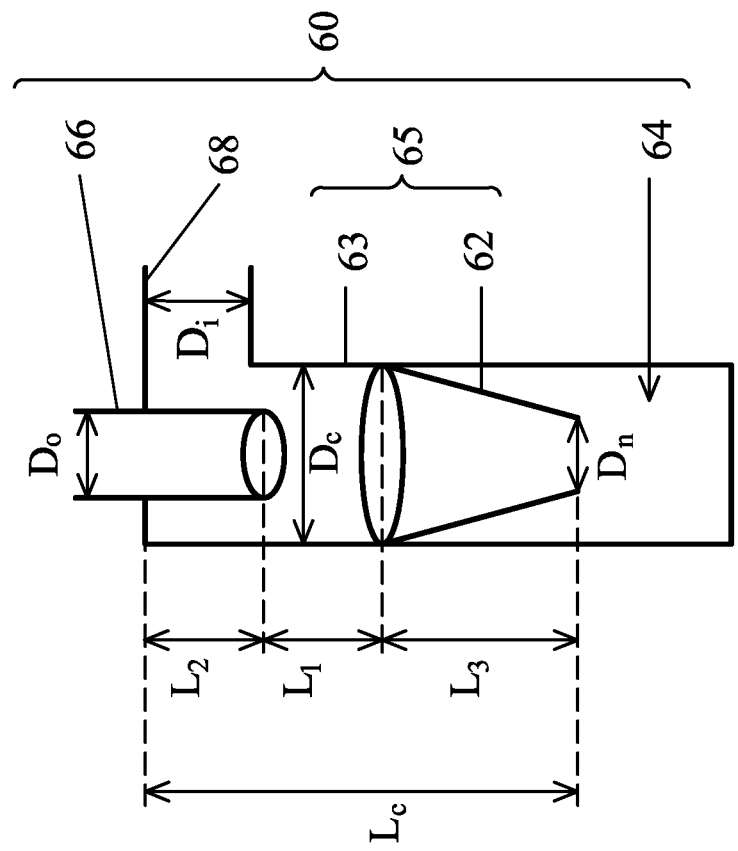
FIG. 9B illustrates an example of a cyclonic particle decontamination unit, in accordance with some embodiments.

FIGS. 9A and 9B illustrate a cyclonic decontamination unit 60. The cyclonic decontamination unit 60 comprises a cyclonic separator 65 and a particle collection unit 64. A cyclone generated inside a cyclonic separator 65 may be used to separate out solid particles present in an incoming dirty gas flow. The separated particles may be collected in the particle collection unit 64. The cyclonic separator 65 comprises a cyclone tube 63 connected to a cyclone cone 62, an inlet tube 68 and an outlet tube 66, as illustrated in FIGS. 9A and 9B. The cyclone cone 62 is a truncated cone having a diameter $D_c$ at the wide side, a diameter $D_n$ at the narrow side, and a height, $L_3$ (indicated in FIG. 9A). A diameter of the wide end of the cyclone cone 62 has a same diameter, $D_c$, as the cyclone tube 63. In some embodiments, $D_c$ may be about 5 cm to about 60 cm. In some embodiments, such as in the cyclonic decontamination unit 60 (illustrated in FIG. 9B), the inlet tube 68 may introduce the incoming gas tangentially into the cyclone tube 63 to help initiate a rotational motion. The height, $D_i$, of the inlet tube 68 illustrated in FIG. 9A, may be about 5 cm to about 60 cm (e.g., 10 cm), and the ratio, $D_i:D_c$, may be about 0.4 to about 1.5. As illustrated in FIG. 9A, the total length of the cyclone tube 63 is ($L_1+L_2$), where $L_1$ refers to the distance between the cyclone cone 62 and the opening of the outlet tube 66 inside the cyclone tube 63, and $L_2$ refers to the length of the portion of the cyclone tube 63 as measured between the opening of the outlet tube 66 inside the cyclone tube 63 and a point where the outlet tube 66 intersects with the wall of the cyclone tube 63. In some embodiments, $L_1$ and $L_2$ may be about 5 cm to about 60 cm; the ratio of the length of the cyclone tube 63 to the diameter of the cyclone cone 62, $(L_1+L_2):D_c$, may be about 0.8 to about 3, and the ratio $L_2:D_c$ may be about 0.4 to about 0.9.

In some embodiments, the bottom of the cyclone cone 62 (the narrow side of the cone) protrudes into a particle collection unit 64, as illustrated in FIG. 9A. The total length, $L_c$, of the cyclonic separator 65 is the sum of the lengths of the cyclone tube 63 and the cyclone cone 62. Accordingly, $L_c=(L_1+L_2)+L_3$. In some embodiments, $L_c$ may be about 10 cm to about 300 cm, and the ratio $L_3:D_c$ may be about 0.5 to about 3.5, such as 2. A ratio of $L_3:D_c$ of less than about 0.5 and greater than about 3.5 results in degraded particle separation efficiency, thereby allowing particles to contaminate the vacuum pump and/or reducing the pumping speed.

The narrow side of the cyclone cone 62 has a diameter $D_n$. The difference between the top (wide) diameter and the bottom (narrow) diameter, $(D_c-D_n)$ is determined by the height, $L_3$, and the taper angle, A, of the cyclone cone 62. The cut diameter of a cyclonic separator, such as the cyclonic separator 65 in FIG. 9A, depends on the geometry of the cyclone tube 63 and the cyclone cone 62. The cut diameter refers to the diameter of the smallest size of a particle that may be efficiently removed from the gas, where efficient removal implies that the probability of removal is greater than half. In some embodiments such as those disclosed herein, the cyclonic decontamination units 60 have a small cut diameter of about 30 µm, reducing the amount of particles that may cause seizures or other malfunctions in the vacuum pump. A larger ratio of $L_c:D_c$ or, alternately, a larger difference $(D_c-D_n)$ provides for smaller particles to be removed efficiently. In some embodiments, $D_n$ may be about 1 cm to about 30 cm, and the ratio $D_n:D_c$ may be about 0.2 to about 0.5. A ratio of $D_n:D_c$ of less than about 0.2 or greater than about 0.5 results in degraded particle separation efficiency and/or cut diameter of the decontamination unit, e.g., the decontamination unit 60, thereby allowing particles to contaminate the vacuum pump and/or reduce the pumping speed.

The solid particles that may drop out of the opening at the narrow end of the cyclone cone 62 are collected in a particle collection unit 64 illustrated in FIG. 9A. At the opposite side of the cyclone separator 65, the outlet tube 66 extends out from inside the cyclone tube 63. In some embodiments, the diameter, $D_o$, of the outlet tube 66 may be about 5 cm to about 60 cm, and the ratio $D_o:D_c$ may be about 0.4 to about 0.8. A ratio of $D_o:D_c$ of less than about 0.4 or greater than about 0.8 results in degraded particle separation efficiency and/or cut diameter of the decontamination unit, e.g., the decontamination unit 60, thereby allowing particles to contaminate the vacuum pump, cause seizures, and/or reduce the pumping speed, or cause other malfunctions in the vacuum pump.

As indicated in FIG. 9B, incoming dirty gas may enter through the inlet tube 68; rotate down the cyclone separator 65; drop some of the solid particles into the particle collection chamber 64 through the bottom opening at the narrow end of the cyclone cone 62; the decontaminated gas returns upwards in a reverse flow along the central axis of the cyclone separator 65, and exits through the outlet tube 66. In some embodiments, the cyclonic decontamination unit, such as the decontamination units 60, may be maintained at a temperature of about 23° C. to about 300° C. The cyclonic decontamination units 60 and 60B illustrated in FIGS. 9A and 9B are by example only; it is understood that other embodiments are possible wherein other geometries may be used, e.g., multiple cones may be present.

Figure 9C:
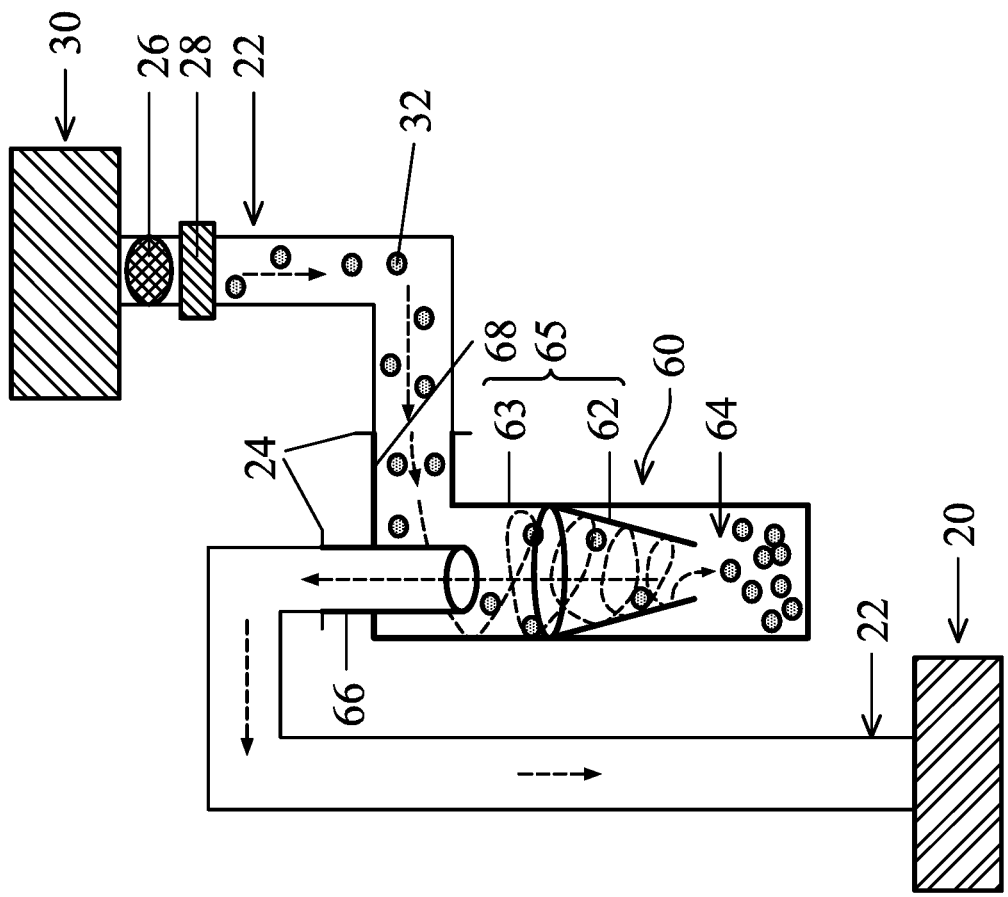
FIG. 9C illustrates an example of a vacuum system in an integrated circuit fabrication facility, in accordance with some embodiments.

FIG. 9C illustrates a vacuum system with the cyclonic decontamination unit 60 of FIG. 9A inserted between a processing chamber 30 and a vacuum pump 20, and connected by pumping lines 22 using, for example, flanges 24. Gas contaminated with solid particles 32 may be flowing from the processing chamber 30 into the inlet tube 68 of the cyclonic decontamination unit 60, and clean gas may be sucked out from the outlet tube 66 of the cyclonic decontamination unit 60 into a pumping line 22 and expelled by the vacuum pump 20 through an exhaust valve (not shown), as illustrated in FIG. 9C by the straight dashed arrows. The particle removal process inside the cyclonic decontamination unit 60 may be accomplished with a cyclone in which the gas takes an indirect path from the inlet tube 68 to the outlet tube 66. In some embodiments, the inlet tube 68 may be curved to connect tangentially to the curved outer wall of the cyclone tube 63. As the dirty gas gets sucked in through the inlet, the incoming angle may induce the gas to follow the curvature of the cylindrical wall, thereby initiating a rotational gas-flow around the central axis of the cyclone tube 63. In some embodiments, the inlet angle may be adequate to generate a vortex in the cyclone tube 63 prior to the gas entering the cyclone cone 62, as in the examples illustrated in FIGS. 9A through 9C. In some other embodiments, an additional vortex generator (e.g., helical vanes, or a helical tube, or a rotatory fan) may be used to force the incoming gas to rotate. The gas flows down the cyclonic separator 65 in a helical path indicated by the spiral dashed arrow in FIG. 9B. During the downward vortical motion, centrifugal force pushes the solid particles 32 towards the walls of the cyclonic separator 65. The denser solid particles 32 acquire a radially outward velocity relative to the spinning gas. Some of the solid particles 32 may collide with the wall and lose speed. As they lose speed, the larger, more massive particles may be unable to spin with the gas early in the flow in the upper portion of the cyclonic separator 65 and begin to fall into the collection unit 64 due to their weight. As the rotating gas moves downward into the cyclone cone 62, the rotational radius of the downward vortex starts to reduce progressively towards the narrow end of the cyclone cone 62. Increasingly smaller particles may suffer more collisions, lose speed, and drop into collection unit 64 because of gravity. Close to the bottom of the cyclone a vertical return flow may be initiated near the central axis. The vortex reverses direction and a narrow inner vortex may form and move rapidly upwards along the center of the cyclonic separator 65 exiting the cyclone in a straight stream flowing into the outlet tube 66, as illustrated in FIG. 9B by a straight dashed arrow.

Figure 9D:
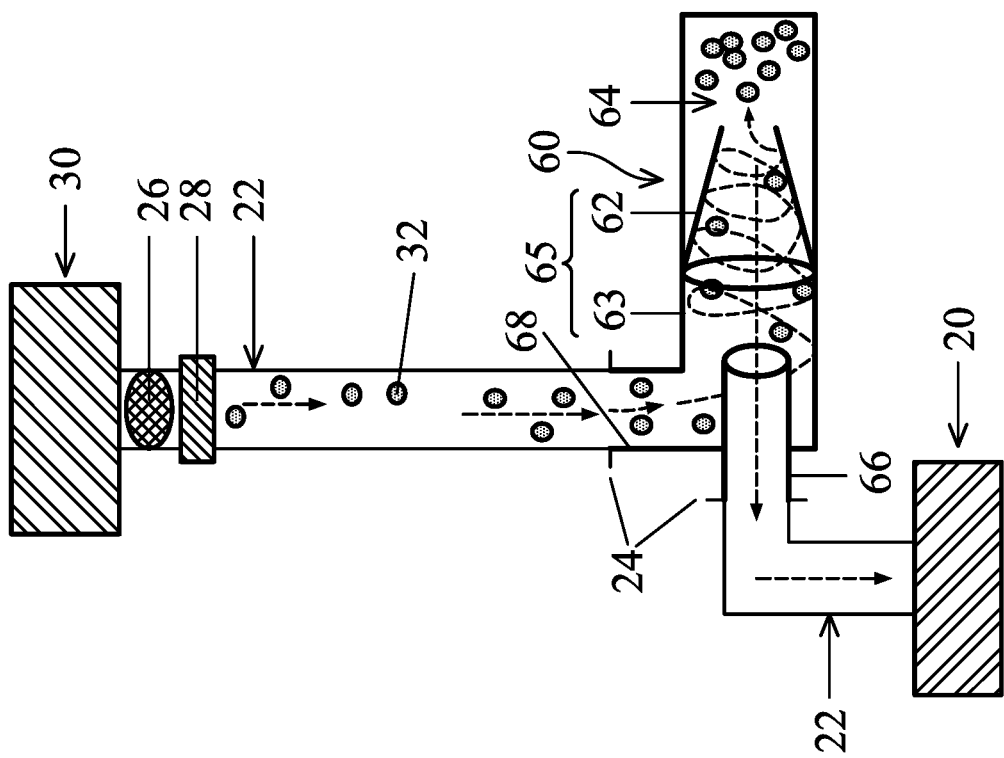
FIG. 9D illustrates an example of a vacuum system in an integrated circuit fabrication facility, in accordance with some embodiments.

The particle separation effect of a cyclone may be viewed as a particle separation by gravity aided by centrifugal forces. Accordingly, in order to increase the effect of gravity in the cyclonic separation and collection of solid particles, the cyclonic decontamination unit 60 may be positioned to orient the axis of the conical separator 65 to be vertical, in accordance with some embodiments. However, the cyclonic decontamination unit 60 may also be operated with the conical separator 65 oriented horizontally, as illustrated in FIG. 9D. One advantage of the horizontal orientation of the cyclone is that the number of 90° bends in the piping is reduced, as understood by comparing the two vacuum systems illustrated respectively in FIGS. 9C and 9D. More bends in the piping would reduce pumping speed and increase the piping space consumed by the cyclonic decontamination unit 60.

This disclosure describes vacuum systems suitable for use in semiconductor integrated circuit fabrication facilities. The embodiments utilize centrifugal forces and gravity to remove solid particles as small as 30 μm or smaller from gas pumped out of processing chambers of semiconductor processing equipment. Vacuum pumps used in semiconductor manufacturing may have clearances as small as 30 μm between moving parts, and between moving parts and stationary parts. The chance of vacuum pump seizure caused by particles jammed in a clearance may be reduced by removing such solid particles in gas flowing in suction tubes. Removing particles from the gas-flow also reduces the build-up of solid deposits on the walls of pumping lines. This also helps reduce down-time resulting from vacuum pump seizure caused by flakes from the solid deposits dropping into a vacuum pump. Furthermore, embodiments described in this disclosure may be used for a self-cleaning application whereby solid deposits in a pumping line may be dislodged by turbulent gas-flow and removed from the gas without having to halt the normal operation of the vacuum system. This self-cleaning effect may reduce the frequency of shutting down a pumping line for periodic maintenance and cleaning. The particle decontamination units described in this disclosure are filterless. Filterless decontamination units described in this disclosure provide an additional advantage over units that require filters because normal operation has to be interrupted periodically to change dirty filters. The advantages provided by the embodiments described herein may reduce the down-time and maintenance cost of vacuum systems used for semiconductor processing, thereby reduce the cost of manufacturing semiconductor integrated circuits.

In an embodiment a decontamination unit for use in semiconductor processing includes a vortex generator coupled to a first vacuum line, the vortex generator includes a helical structure; a particle trapper coupled to the vortex generator, the vortex generator is operationally interposed between the first vacuum line and the particle trapper, the vortex generator imparting a vortical gas flow into the particle trapper; a second vacuum line coupled to the particle trapper, the particle trapper is operationally interposed between second vacuum line and the vortex generator; and a vacuum pump coupled to the second vacuum line, the second vacuum line is operationally interposed between vacuum pump and the particle trapper. In an embodiment the helical structure includes a tube shaped into a helix. In an embodiment the helical structure includes a twisted-drill helical vane. In an embodiment the helical structure includes an auger helical vane. In an embodiment the particle trapper includes a first tube connected to an outlet of the vortex generator; a second tube connected to the second vacuum line, the second tube extending into the first tube; and a trapper flap connected an exterior of the second tube, the trapper flap being interposed between the first tube and the second tube. In an embodiment a distance between the helical structure and the second tube is between 5 cm and 150 cm. In an embodiment the particle trapper includes a first tube connected to an outlet of the vortex generator; a second tube connected to the second vacuum line, the second tube extending into the first tube; and a trapper flap connected an interior of the first tube, the trapper flap being interposed between the first tube and the second tube. In an embodiment a distance between the helical structure and the second tube is between 5 cm and 150 cm. In an embodiment the vortex generator comprises a straight tube with the helical structure within the straight tube. In an embodiment a diameter of the straight tube is less than an outer diameter of particle trapper.

In an embodiment a decontamination unit for use in semiconductor processing includes a vortex generator having a first input tube and a helix structure; and a particle trapper having an outer tube, a trapper element, and an inner tube, the inner tube extending into the outer tube, an area between the inner tube and the outer tube forming a trapping chamber, the particle trapper being coupled to the vortex generator to form a gas flow path, the gas flow path extends from the first input tube through the helix structure in a circular manner, extends from the helix structure into the trapping chamber, extends from the trapping chamber past the trapper element, and extends from the trapper element through the inner tube. In an embodiment the trapper element includes a flapper connected to an outer sidewall of the inner tube. In an embodiment the trapper element includes a flapper connected to an interior sidewall of the outer tube. In an embodiment the helix structure includes a tube shaped into a helix. In an embodiment the helix structure includes a twisted-drill helical vane. In an embodiment the helix structure includes an auger helical vane.

In an embodiment a method of forming a vacuum in semiconductor processing, the method includes pumping contaminated gas from a first semiconductor processing chamber through a first tube; flowing the contaminated gas from the first tube into a vortex generator, the vortex generator flows the contaminated gas through a helix structure to create a vortical contaminated gas flow; flowing the vortical contaminated gas flow through a trapping chamber to form a processed gas flow; and flowing the processed gas flow from the trapping chamber to a vacuum pump. In an embodiment the trapping chamber includes an inner tube, an outer tube, and a trapping element, the inner tube extends into the outer tube, and the trapping element includes a flapper connected to an outer sidewall of the inner tube or an inner sidewall of the outer tube. In an embodiment the inner tube protrudes into the vortex generator. In an embodiment the vortex generator includes a tube having the helix structure within the tube.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    introducing a carrier gas into a semiconductor processing chamber;
    introducing a first gas into the semiconductor processing chamber;
    introducing a second gas into the semiconductor processing chamber, wherein the first gas reacts with the second gas and forms solid by-products;
    pumping the carrier gas and the solid by-products from the semiconductor processing chamber through a vortex generator, wherein the vortex generator creates a vortical contaminated gas flow that applies a centrifugal force to the solid by-products in the carrier gas, wherein the centrifugal force is applied by flowing the carrier gas and the solid by-products through a helix shaped tube in the vortex generator, wherein the helix shaped tube has a continuous uniform inner diameter, the helix shaped tube having a first plane located where the carrier gas and the solid by-products from the semiconductor processing chamber enters the helix shaped tube and a second plane located where the vortical contaminated gas flow leaves the helix shaped tube, the first plane being parallel to the second plane, wherein the helix shaped tube revolves around a first axis, the first axis being perpendicular to the first plane and spanning between the first plane and the second plane;
    flowing the vortical contaminated gas flow through a first pumping line, the first Pumping line having the second plane located where the vortical contaminated gas flow enters the first pumping line and a third plane located where the vortical contaminated gas flow leaves the first pumping line, the second plane being perpendicular to the third plane;
    flowing the vortical contaminated gas flow through a trapping chamber, wherein the trapping chamber reduces a number of solid by-products in the carrier gas by collecting at least a portion of the solid by-products spun from the carrier gas by the centrifugal force, the trapping chamber having the third plane located where the vortical contaminated gas flow enters the trapping chamber and a fourth plane located where the carrier gas leaves the trapping chamber, the third plane being parallel to the fourth plane, wherein the trapping chamber has a second axis, the second axis running along a centerline of the trapping chamber between the third plane and the fourth plane, the second axis being perpendicular to the third plane, wherein the first axis is perpendicular to the second axis; and
    flowing the carrier gas to a vacuum pump.

2. The method of claim 1, further comprising opening an isolation valve, the isolation valve being positioned between the semiconductor processing chamber and the vortex generator.

3. The method of claim 1, wherein the helix shaped tube has a helix angle between about 5 degrees to about 85 degrees.

4. The method of claim 1, wherein the helix shaped tube has a length between about 5 cm to about 100 cm.

5. The method of claim 1, wherein before the flowing the vortical contaminated gas flow through the trapping chamber the vortical contaminated gas flow circulates around a corner in the first pumping line.

6. The method of claim 1, wherein the first pumping line is at a system pressure, wherein the system pressure is less than about 1 Torr.

7. A method of forming a semiconductor device, the method comprising:
    pumping contaminated gas from a first semiconductor processing chamber through a first pumping line, the contaminated gas comprising solid by-products and the contaminated gas having a first flow profile;
    flowing the contaminated gas from the first pumping line into a vortex generator, the vortex generator having a first axis of symmetry, the first axis of symmetry being horizontal and parallel to the first flow profile, wherein the vortex generator flows the contaminated gas through a helix structure to create a vortical contaminated gas flow, the vortical contaminated gas flow having a second flow profile, wherein the helix structure has a continuous spiral shape;
    flowing the vortical contaminated gas flow through a second pumping line, wherein the flowing the vortical contaminated gas flow through the second pumping line removes solid deposits on a sidewall of the second pumping line;
    after flowing the vortical contaminated gas flow through the second pumping line, flowing the vortical contaminated gas flow through a trapping chamber to form a processed gas flow, the trapping chamber having a second axis of symmetry, the second axis of symmetry being vertical and parallel to the second flow profile, the processed gas flow having fewer solid by-products than the contaminated gas; and
    flowing the processed gas flow from the trapping chamber through a third pumping line to a vacuum pump.

8. The method of claim 7, wherein the trapping chamber comprises an inner tube, an outer tube, and a trapping element, wherein the inner tube extends into the outer tube, and wherein the trapping element comprises a flapper connected to an outer sidewall of the inner tube or an inner sidewall of the outer tube.

9. The method of claim 7, wherein the vortex generator comprises a tube having the helix structure within the tube, wherein the contaminated gas flows through the tube.

10. The method of claim 7, wherein the helix structure comprises a twisted-drill helical vane.

11. The method of claim 7, wherein the helix structure comprises an auger helical vane.

12. The method of claim 7, wherein the helix structure comprises stationary vanes.

13. The method of claim 7, wherein the vacuum pump is a cryogenic vacuum pump.

14. A method of forming a semiconductor device, the method comprising:
pumping gas through a first pumping line;
flowing the gas from the first pumping line into a vortex generator, wherein the vortex generator flows the gas through a helix structure to create a vortical gas flow, and wherein the helix structure has a continuous spiral shape;
flowing the vortical gas flow through a second pumping line with solid deposits located along a sidewall of the second pumping line, the vortical gas flow removing the solid deposits from the sidewall of the second pumping line, wherein the second pumping line is a cylindrical tube, the cylindrical tube having an inner diameter, an outer diameter, and a continuous material spanning between the inner diameter and the outer diameter, wherein the cylindrical tube has a first bend, the first bend occurring across the continuous material spanning between the inner diameter and the outer diameter, wherein the cylindrical tube is in direct physical contact with the vortex generator;
after the flowing the vortical gas flow through the second pumping line, flowing the vortical gas flow through a trapping chamber to form a processed gas flow, the trapping chamber removing solid particles from the vortical gas flow, the trapping chamber being in direct physical contact with the cylindrical tube of the second pumping line; and
flowing the processed gas flow from the trapping chamber through a third pumping line.

15. The method of claim 14, wherein pumping the gas through a first pumping line comprises pumping the gas from a first semiconductor processing chamber, wherein the gas comprises solid by-products.

16. The method of claim 14, wherein the trapping chamber comprises an inner tube and an outer tube, wherein the inner tube extends into the outer tube.

17. The method of claim 16, wherein the trapping chamber further comprises a trapping element interposed between the inner tube and the outer tube, and wherein the trapping element comprises a flapper connected to an outer sidewall of the inner tube or an inner sidewall of the trapping chamber.

18. The method of claim 17, wherein the outer tube has a first width adjacent the inner tube and a second width adjacent an end of the inner tube, wherein the first width is greater than the second width.

19. The method of claim 14, wherein the vortex generator comprises a tube having the helix structure within the tube, wherein the gas flows through the tube.

20. The method of claim 14, wherein the second pumping line further comprises at least one corner located at the at least one bend along a pathway in the second pumping line, the solid deposits being located adjacent to the at least one corner.

* * * * *

UNITED STATES PATENT AND TRADEMARK OFFICE
CERTIFICATE OF CORRECTION

PATENT NO. : 11,525,185 B2
APPLICATION NO. : 16/573235
DATED : December 13, 2022
INVENTOR(S) : Ming-Fa Wu et al.

It is certified that error appears in the above-identified patent and that said Letters Patent is hereby corrected as shown below:

In the Claims

Claim 1, Column 17, Line 54; delete "the first Pumping" and insert --the first pumping--.

Signed and Sealed this
Twenty-fourth Day of January, 2023

Katherine Kelly Vidal
*Director of the United States Patent and Trademark Office*